United States Patent [19]

Fukuda et al.

[11] Patent Number: 4,613,887

[45] Date of Patent: Sep. 23, 1986

[54] SEMICONDUCTOR DEVICE WITH A MEANS FOR DISCHARGING CARRIERS

[75] Inventors: Takeshi Fukuda; Yoshiharu Mitono, both of Tokyo; Tadashi Kiriseko, Kanagawa, all of Japan

[73] Assignee: Fujitsu Limited, Kawasaki, Japan

[21] Appl. No.: 574,583

[22] Filed: Jan. 27, 1984

Related U.S. Application Data

[63] Continuation of Ser. No. 204,930, Nov. 7, 1980, abandoned.

[30] Foreign Application Priority Data

| Nov. 14, 1979 | [JP] | Japan | 54-147454 |
| Dec. 15, 1979 | [JP] | Japan | 54-162959 |
| Dec. 15, 1979 | [JP] | Japan | 54-162960 |

[51] Int. Cl.$^4$ .................. H01L 27/04; H03K 19/013; H03K 19/088

[52] U.S. Cl. ..................... 357/43; 307/280; 307/456; 357/22; 357/48; 357/51; 357/15

[58] Field of Search ............... 307/456, 280; 357/22, 357/48, 51, 43, 15

[56] References Cited

U.S. PATENT DOCUMENTS

| 3,676,713 | 7/1972 | Wiedmann | 307/456 |
| 3,693,032 | 9/1972 | Winnard | 307/456 |
| 4,095,252 | 6/1978 | Ochi | 357/22 |
| 4,118,640 | 10/1978 | Ochi et al. | 307/280 |
| 4,198,649 | 4/1980 | Berry | 357/22 |
| 4,266,233 | 5/1981 | Bertotti et al. | 357/22 |
| 4,323,913 | 4/1982 | Murrmann et al. | 357/50 |

Primary Examiner—William D. Larkins
Attorney, Agent, or Firm—Staas & Halsey

[57] ABSTRACT

In an output transistor of transistor-transistor logic (TTL) circuits, an output transistor of TTL is provided with, in a region between a p-type base region and the p-type semiconductor substrate on which a TTL circuit is fabricated, a p$^-$ diffusion which causes carriers stored in the base region when the output transistor is switched from ON state to OFF state to be discharged quickly. When the output transistor is OFF, the p$^-$ diffusion is pinched off and no current flows. Thus, when the output transistor is switched from OFF state to ON state, the output voltage changes sharply. Because of this, the switching speed of the TTL is improved. In another embodiment, a p$^-$ region is formed between a p-type base region and p+ isolation diffusion, and an n+ diffusion is formed to cover at least one part of the p$^-$ diffusion and is connected to an n-type collector region. In another embodiment, a p-type base region extends to the p+ isolation diffusion, and an n+ diffusion is formed in a region between the base region and the isolation diffusion and is connected to an n-type collector region.

3 Claims, 13 Drawing Figures

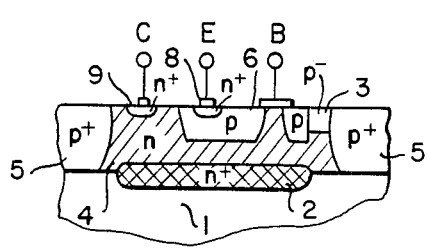
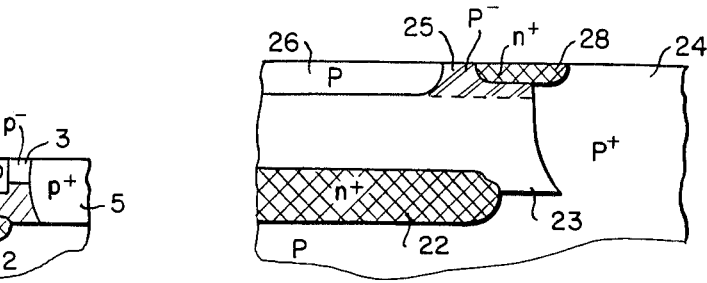
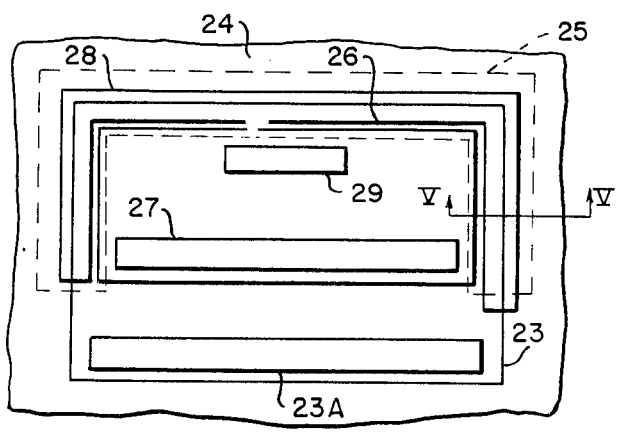
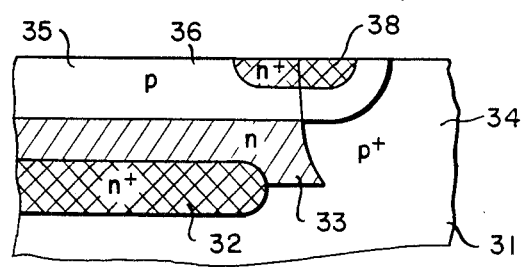
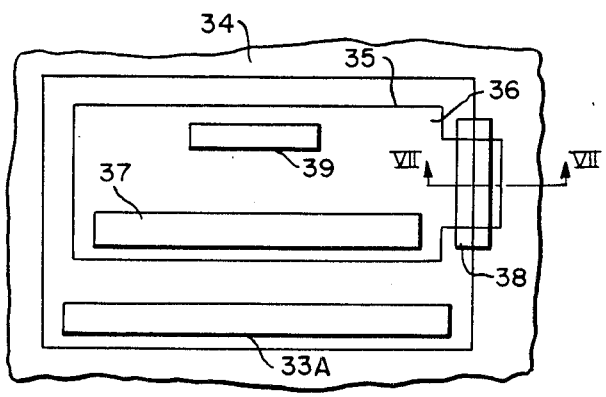

SEMICONDUCTOR DEVICE WITH A MEANS FOR DISCHARGING CARRIERS

This is a continuation of application Ser. No. 204,930, filed Nov. 7, 1980 now abandoned.

BACKGROUND OF THE INVENTION

The present invention relates to a semiconductor device suitable for performing high speed switching, for example, an improved structure for transistor-transistor logic (TTL) circuits.

TTL circuit are most widely used for bipolar integrated circuits such as large scale integrated circuits (LSI) or very large scale integrated circuits (VLSI), for example because of its low power dissipation and faster speed of operation than diode transistor logic (DTL) circuits. Efforts have been made recently to discharge carriers stored in a base portion of an output transistor when it is switched from the ON state to the OFF state.

A typical TTL circuit is shown in FIG. 1, wherein the output transistor is designated by $Tr_1$ and the multi-emitter input transistor by $Tr_2$. This multi-emitter transistor $Tr_2$ performs the circuits's logic function, with inputs being supplied to emitters of transistor $Tr_2$. Resistor $R_L$ shown in FIG. 1 is provided for discharging minority carriers stored in the base region of the transistor $Tr_1$ when the output of the TTL circuit is switched from low level, that is, when the transistor $Tr_1$ is switched to high level or from ON state to OFF state. This serves to improve the speed of operation.

On the other hand, it is observed that, contrary to the case where the output is switched from low level to high level, the TTL circuit shown in FIG. 1 delays the operation of turning OFF transistor $Tr_4$ which is ON when the output of the TTL circuit is switched from high to low level. In a transient period when the output changes from high to low level, by virtue of resistor $R_L$, a current flows from resistor $R_1$ to resistor $R_L$ via transistor $Tr_3$, making the change of the collector voltage of the output transistor slower for the transition from high level to low level. Thus, resistor $R_L$ functions rather adversely for high speed switching of the output transistor from high level to low level.

It has been suggested to replace resistor $R_L$ of FIG. 1 by a transistor or a diode and resistance connected in series, as in U.S. Pat. No. Re. 27804. However, this proposal is not effective in solving the problem described above, and the transfer characteristics at the output level have not been significantly improved. In addition, providing a transistor or a diode and resistance takes up chip area beside involving additional steps to make them.

SUMMARY OF THE INVENTION

In efforts to find a method to extract the base current at the time of switching the output of a TTL transistor of a TTL circuit, from ON state to OFF state, the inventors of the present invention theorized as follows the: characteristics required of a circuit or device to draw out the base current in question are that practically no current is allowed to flow when the base potential is somewhat smaller than the potential of the ON state, but a substantial amount of current is permitted to flow near the potential of the ON state.

The inventors found a way of fabricating a structure provided with a path for a leak current in a region between the base and an isolation diffusion of a transistor. Such a structure is realized by forming a $p^-$ diffusion in a region covering a part, or the whole, of the region between the base and the isolation diffusion of a transistor. However, this $p^-$ diffusion must have such an impurity concentration that it is pinched off by widening of the depletion layer when the collector potential is at high level. When the collector (output) is at low level, widening of the depletion layer is small, so that the resistance is small, causing the base current to be sufficiently discharged.

It is therefore the general object of this invention to offer an output transistor having such a structure as to improve the switching characteristics without providing the resistor $R_L$ as shown in FIG. 1. The transistor of the invention has a doped region between the base region of an output transistor and a semiconductor substrate at ground which has the same conductivity type as the base region and the substrate, but which is doped more lightly than the base region.

It is another object of the invention to provide an output transistor of a TTL circuit having a carrier path between the base and ground which is not conductive or is conductive corresponding to ON and OFF states of the transistor, and which when the transistor is turned OFF from the ON state, allows carriers stored at the junction to be quickly discharged, thus improving the switching speed.

BRIEF DESCRIPTION OF THE DRAWINGS

In the drawings wherein like parts are marked alike:

FIG. 4 shows a simplest embodiment of the invention, FIGS. 5 and 6 are cross-sectional and plan views respectively of an essential part of another embodiment of the invention, and FIGS. 7 and 8 are the views similar to FIGS. 5 and 6 respectively of a further embodiment of the invention.

DESCRIPTION OF THE PREFERRED EMBODIMENTS

Figure 2A:
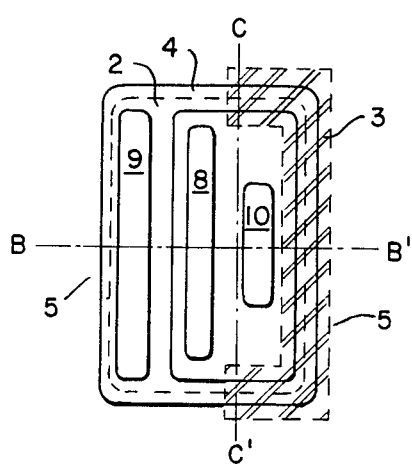
FIG. 2A is a plan view of an output transistor according to the present invention.
Figure 2B:
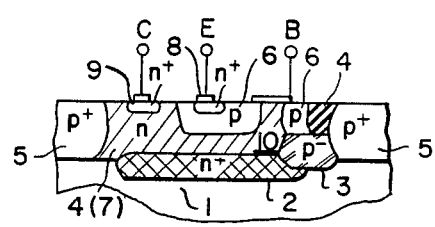
FIGS. 2B and 2C are cross-sectional views along the lines B-B' and C-C' of FIG. 2A, FIGS. 3A to 3D are cross-sectional views illustrating the steps for manufacturing the device shown in FIG. 2A.
Figure 2C:
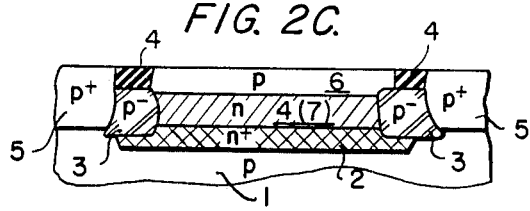

A plan view of an output transistor $Tr_1$ according to the present invention is shown in FIG. 2A, with FIG. 2B and FIG. 2C showing cross-sectional views along the lines B-B' and C-C' of FIG. 2A. An $n^+$ layer 2 is buried in a p-type semiconductor substrate 1, and a $p^-$ diffusion 3 is formed in accordance with the principle of the invention. This $p^-$ diffusion 3 connects a $p^+$ isolation diffusion 5 formed in an n-type expitaxial layer 4 and a p-type base region 6. A part of the conventional collector region having the reference character 4(7) is thus replaced by the $p^-$ diffusion 3.

Figure 1:
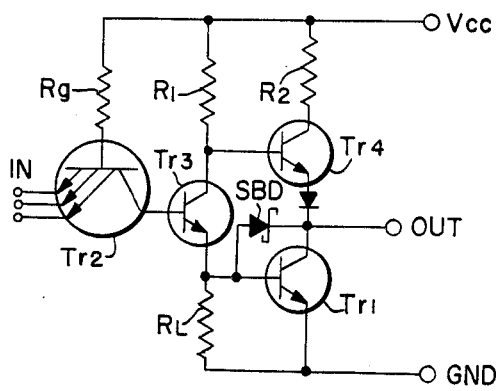
FIG. 1 is a circuit diagram of a typical TTL circuit.

An $n^+$ emitter region 8 and a collector contact diffusion 9 are formed, and a part 10 within the base region 6 provides the Schottky barrier diode SBD shown in FIG. 1 which serves the purpose of speeding up the switching operation when the output of the TTL circuit changes from low level to high level as is the case with resistor $R_L$ of FIG. 1.

As will be apparent from FIGS. 2A to 2C, the $p^-$ diffusion 3 is interposed between the p-type semiconductor substrate 1, the ground side, p+ isolation diffusion 5 and the p-type base region 6. Thus, when the output transistor Tr$_1$ is ON, the p$^-$ diffusion 3 functions as a resistance conductor from the base to the substrate, and when the transistor Tr$_1$ is switched from ON to OFF (that is, the output goes from low level to high level), carriers stored in the base region are caused to be discharged quickly through the p$^-$ diffusion 3. This contributes to a high speed switching operation.

When the transistor Tr$_1$ is in an OFF state, the electrical potential of the collector region 4 is raised, so that the depletion layer widens in p$^-$ diffusion 3 to pinch off the channel, preventing current flow. Because of this, until the base current of Tr$_3$ is large enough, no current flows through the resistor R$_1$. The base potential of Tr$_4$, therefore, changes sharply and the output voltage also changes sharply. Therefore, p$^-$ diffusion 3 which partially replaces the collector region of transistor Tr$_1$ serves to expedite the high speed switching operation when the output is switched from low level to high level, and when the output is switched from high level to low level, p$^-$ diffusion 3 performs no function. Thus, in the device according to the present invention, switching characteristics are further improved as compared with TTL circuits having the resistor R$_L$.

A method of manufacturing the embodiment of the invention described above will now be explained with reference to FIGS. 3A to 3D which show steps to carry out the method.

Figure 3A:

First, as shown in FIG. 3A, an oxidized film 11 is formed on a p-type semiconductor substrate 1 by heat treatment at high temperature, and then a window is opened in the film 11 by known photolithographic process for fabricating a buried layer 2 by diffusion of antimony (Sb) or arsenic (As). In this process, an oxidized film 11 is also formed on the surface of buried layer 2 due to the diffusion process at high temperature.

Figure 3B:
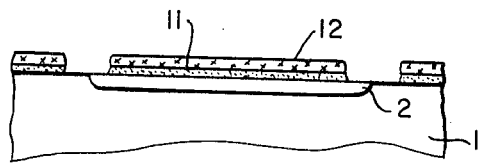

Next, as shown in FIG. 3B, a photolithographic process is again carried out to open windows at places where p$^-$ diffusions are to be formed, and a suitable amount of boron ions are implanted, leaving the film 12 of photoresist as it is.

Figure 3C:
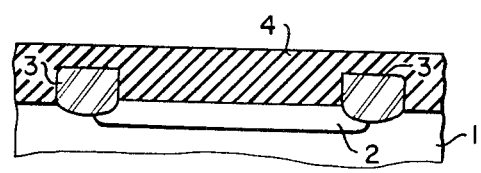

Then, as shown in FIG. 3C, the photoresist film 12 is completely removed, and the oxidized film 11 is also removed using a solution of fluoric acid. Thereafter, the epitaxial layer 4 is grown by conventional vapor phase deposition. In this process, p$^-$ diffusions 3 are diffused upwardly within the epitaxial layer 4 as shown because the diffusion coefficient of boron is large. The buried layer 2 is also diffused upwardly, but since the diffusion coefficient of antimony or arsenic is smaller than that of boron, the buried layer 2 is diffused less than p$^-$ diffusions 3.

Figure 3D:
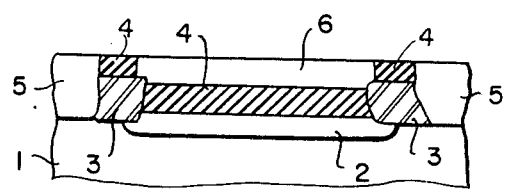

Further, p+ isolation diffusions 5 are formed as shown in FIG. 3D, a p-type base region 6 is also formed, both by conventional diffusion process. Then, the p$^-$ diffusions are in contact with the base region and the isolation diffusions.

After these processes are over, the transistor-transistor logic (TTL) circuit is fabricated in accordance with prior art technology.

It will be understood from the foregoing description that the p$^-$ diffusions 3 of the output transistor Tr$_1$ can easily be formed by implantation of boron ions before formation of epitaxial layer 4. The process of ion implantation is the only process that is added to the prior art method of TTL fabrication. No changes or additional steps are required to manufacture the semiconductor device of the present invention.

As will be understood from the foregoing description, no special resistance such as resistance R$_L$ shown in FIG. 1 is required in the embodiment of the invention. By providing within a transistor a region such as the p$^-$ diffusion diffused lightly with impurities which has the effect of improving the switching speed, the characteristics of a TTL circuit are greatly improved.

However, the resistance 3 in FIG. 3D must be formed separately, and to do so takes up chip area. Such a proposal is not in line with the recent trends to increase packing density of integrated circuits. A simple embodiment of the present invention in FIG. 4.

In FIG. 4 and FIGS. 2B and 2C the same reference numbers designate the same parts of the device. In this embodiment, the p$^-$ layer 3 is formed after formation of the epitaxial layer 4.

Here, a quantitative review will be made to determine whether or not desired characteristics can be obtained by the structure of FIG. 4. Assuming a step junction, the depletion layer $\chi p$ extending in the p$^-$ diffusion is given as follows (considering $N_A = N_D$):

$$\chi p = \frac{1}{2} \sqrt{\frac{2k_s\epsilon_o}{q} \cdot \frac{N_A + N_D}{N_A N_D} \cdot \phi T}$$

Taking a case where $N_A = 1.5 \times 10^{16}/\text{cm}^3$, and also considering that $\phi_B = 0.7$ V, $V_{OL} = 0.4$ V and $V_{OH} = 2.5$ V, $\chi p$ when $\phi_T = (0.7 + 2.5)V = 3.2$ V is $$\chi p = \frac{1}{2} \sqrt{2 \times 6.52 \times 10^6 \times \frac{3 \times 10^{16}}{1.5 \times 1.5 \times 10^{32}} \times 3.2}$$

$$= 0.373 \ \mu m.$$

And $\chi p$ when $\phi T = (0.7 + 0.4)V = 1.1$ V is $\chi p = 0.219 \ \mu m$. Thus, $(0.373 - 0.219) \ \mu m = 0.154 \ \mu m$ is the width of the depletion layer that varies. $N_A = 1.5 \times 10^{16}/\text{cm}^3$ corresponds to $\rho = 1.0 \ \Omega \cdot \text{cm}$, so that the resistance between the base region and isolation diffusion at $V_{OL}$ is $$R = 1.0 \times \frac{L}{0.154 \cdot w} \times 10^4 = 6.49 \times 10^4 \times \left(\frac{L}{w}\right)$$

where L is the distance between the base and isolation, and the w is the length along the periphery of the base. In order to obtain R = 3KΩ, (L/W) must be equal to $4.62 \times 10^{-2}$. For this condition, if L = 3 $\mu m$, then w≃65 $\mu m$. The amount Q of impurities then will be $$Q = 1.5 \times 10^{16} \times 0.373 \times 10^{-4} \simeq 5.6 \times 10^{11}/\text{cm}^2.$$

From the above, it will be understood that, by properly selecting the amount of the dose of the impurities, sufficient resistance may be obtained by a conventional technique for manufacturing integrated circuits.

The basis for the above conclusion is derived from the following:

(1) The amount of impurities (the dose in ion implantation) may be obtained from the condition for pinch off.

$$\chi_P = \frac{N_D}{N_A + N_D} \sqrt{\frac{2k_s\epsilon_o}{q} \cdot \frac{N_A + N_D}{N_A \cdot N_D}(\phi_B + V_{OH})}$$

$$Q_O = N_A \chi_P = \frac{N_A \cdot N_D}{N_A + N_D} \sqrt{\frac{2k_s\epsilon_o}{q} \cdot \frac{N_A + N_D}{N_A \cdot N_D}(\phi + V_{OH})}$$

$$= \sqrt{\frac{2k_s\epsilon_o}{q} \cdot \frac{N_A \cdot N_D}{N_A + N_D}(\phi_B + V_{OH})}$$

Where the collector potential is at V, the amount of carriers is $$Q_O - \sqrt{\frac{2k_s\epsilon_o}{q} \cdot \frac{N_A \cdot N_D}{N_A + N_D}(\phi_B + V)}$$

Considering that $$\rho s = \frac{1}{q\mu Q}, R = \rho s \frac{L}{w}$$

R then depends on V as follows:

$$R = \frac{1}{q\mu \left( Q_O - \sqrt{\frac{2k_s\epsilon_o}{q} \cdot \frac{N_A \cdot N_D}{N_A + N_D}(\phi_B + V)} \right)} \cdot \frac{L}{w}$$

Reference will now be made to FIG. 5 which shows in cross-section an essential part of another embodiment of this invention and to FIG. 6 which shows the embodiment of FIG. 5 in plan view.

In these figures, n+ buried layer 22 is formed in a p-type silicon substrate 21, and n-type collector region 23, p+ isolation diffusion 24, p− diffusion 25, p-type base region 26, n+ emitter region 27, n+ diffusion 28, Schottky barrier diode (SBD) region 29, and collector contact diffusion 23A are fabricated in accordance with known techniques. The n+ diffusion 28 is shorted to collector region 23.

In this embodiment, when collector region 23 and consequently n+ diffusion 28 are at a high level and the base region 26 is at a low level, that is, when the transistor is about to be turned ON, the depletion layer extends from the first p-n junction formed by the collector region 23 and p− diffusion 25 and the second p-n junction formed by the p− diffusion 25 and n+ diffusion 28 respectively to pinch off the region between the base region 26 and the isolation diffusion 24, whereupon the device shown effectively performs the function of a transistor. Conversely, when the collector region 23 and consequently n+ diffusion 28 are at a low level and the base region 26 is at a high level, that is, when the transistor is about to be turned OFF, the depletion layer virtually does not extend from either the first p-n junction or the second p-n junction. Thus, since the base region 26 and the isolation diffusion 24 are interconnected, stored carriers are discharged quickly.

Instead of forming n+ diffusion 28 as seen in the above embodiment, the channel may be pinched off by a depletion layer extending from a p-n junction formed by collector region 23 and p− diffusion 25, but in that case the carrier path established between the base region 26 and isolation diffusion 24 when the collector region 23 is at low level should be approximately ½ of that obtained in the embodiment of the invention shown in FIG. 4, assuming that the surface area of p− diffusion 25 is the same. It will be apparent further that the n+ diffusion 28 may be formed so as to cover the entire surface of p− diffusion 25.

As will be understood from the foregoing description of another embodiment of this invention, in an output transistor of A TTL circuit for example, there are formed between the base region and the isolation diffusion a region diffused with impurities having the same conductivity type as, and of less concentration than, that of the base region and the isolation diffusion, and a further region diffused with impurities of the same conductivity as that of the collector region, said further region covering at least a part of the first mentioned region diffused with impurities and being inter-connected with the collector region. Thus, when the transistor is ON, the region between the base and the isolation diffusion is pinched off by widening of the depletion layer, and when the transistor is in an OFF state, the depletion layer is not widened, the carrier passage between the base region and the isolation diffusion is opened to discharge carriers stored when the transistor was ON. This improves the switching speed of the semiconductor device. Conventional photolithographic processes and a process for diffusion of impurities are used in fabricating the device described above, and no particular difficulties are experienced in such fabrication.

In a further embodiment of the invention comprising the TTL as shown in FIG. 1, a carrier passage which turns OFF and ON corresponding to ON and OFF states of the transistor is established between the base region and the ground, and when the transistor is turned OFF from the ON state, carriers stored at the junction are caused to be discharged quickly to improve the switching speed of the device.

Referring to FIGS. 7 and 8 which show an essential part of the embodiment in cross-section and plan view respectively, n+ buried layer 32 is formed in a p-type silicon substrate 31, and n-type collector region 33, p+ isolation diffusion 34, p-type base region 35, p-type extension region 36 of the base region, n+ emitter region 37, n+ diffusion 38, Schottky barrier diode (SBD) region 39 and collector-contact diffusion 33A are formed by a conventional technique. The n+ diffusion 38 is shorted to the collector region 33.

In this embodiment, when the collector region 33 and consequently the n+ diffusion 38 are at a high level and the base region 35 is at a low level, that is, when the transistor is about to be turned ON, a depletion layer extends from both the first p-n junction formed by the collector region 33 and the p-type extension region 36 of the base region and the second p-n junction formed by the p-type extension region 36 of the base region and the n+ diffusion 38 to pinch off the region between the base region 35 and the isolation diffusion 34. Then, the device can effectively perform the operation of a transistor. Conversely, when the collector region 38 and consequently the n+ diffusion 38 are at a low level and the base region 35 is at a high level, that is, when the transistor is about to be turned OFF, the depletion layers from the abovedescribed first and second junctions practically do not widen, so that the region between the base region 35 and the isolation diffusion remains interconnected. Stored carriers are quickly discharged.

The n+ diffusion 38 of this embodiment is not limited to the position shown in the drawing. What is important is that it is situated between the base region 35 extended toward the isolation diffusion 34 and the isolation diffusion 34 so that the depletion layers are extended therebetween to pinch off carrier passage.

As will be understood from the foregoing, the invention enables, in an output transistor of a semiconductor device such as a TTL circuit, to the extending of the base region to make contact with the isolation diffusion, and a diffusion layer of the same conductivity type as that of the collector region and which is interconnected to the collector region to be situated therebetween, so that when the transistor is on a depletion layer extends between the base region and the isolation diffusion to pinch off carrier passage, and when the transistor is OFF, the depletion layers are not widened, allowing carrier passage between the base region and the isolation diffusion to discharge quickly carriers stored while the transistor was ON. The switching speed of the semiconductor device is thus improved. In order to fabricate such a device, conventional photolithographic and doping processes are utilized, and no particular difficulties are experienced.

As has been described so far, the primary object of the invention is to offer a simple device which improves the switching speed of the semiconductor device and which can be manufactured without any particular difficulties using conventional technology. It should also be understood that although a TTL circuit was used to explain the advantages of the invention, the scope of the invention is not limited to TTL circuits but may be employed in other integrated circuits to effectively improve the switching operation.

Thus, the invention having been described in its best embodiment and mode of operation, that which is desired to be protected by Letters Patent is:

We claim:

1. A semiconductor device comprising
   a semiconductor substrate of a first conductivity type,
   a semiconductor layer of a second conductivity type opposite to said first conductivity type on said substrate,
   a base region of said first conductivity type in said semiconductor layer,
   an emitter region of said second conductivity type in said base region,
   an isolation region of said first conductivity type in said semiconductor layer, reaching to said substrate and surrounding said base region,
   means for Schottky clamping said base region to said semiconductor layer, and
   means for discharging carriers including a first diffused region of said first conductivity type for electrically connecting said base region and said isolation region with a predetermined resistance value when said base region is forward biased with respect to said semiconductor layer, and for electrically isolating said base region from said isolation region when the potential of said base region is reverse biased with respect to said semiconductor layer.

2. The device of claim 1, comprising a second diffused region of said second conductivity type in said first diffused region, said second diffused region being electrically connected to said semiconductor layer.

3. The device of claim 1, wherein said first diffused region is located in said semiconductor layer between said base region and said isolation region, and has an impurity distribution for discharging said carriers from said base region with said predetermined resistance depending on the forward and reverse bias of said base region.

* * * * *

UNITED STATES PATENT AND TRADEMARK OFFICE
CERTIFICATE OF CORRECTION

PATENT NO. : 4,613,887

DATED : 23 September 1986

INVENTOR(S) : Fukuda et al

It is certified that error appears in the above-identified patent and that said Letters Patent is hereby corrected as shown below:

Column 1, line 13, "circiut" should be --circuits--;
line 29, "level, that is, when the transistor $T_{r1}$ is" should be --level--;
line 30, delete "switched"; "level or" should be --level, that is, when the transistor $T_{r1}$ is switched--;
line 36, delete "of the TTL circuits";
line 38, before "Changes" insert --of the TTL circuits--;
line 59, "follows" to --follows:--;
line 60, "the:" should be --the--.

Column 2, line 24, "which" should be --which,--.

Column 4, line 14, after "invention" insert --is shown--;
line 54, "(L/W)" should be --(L/w)--.

Column 5, line 65, "case" should be --case,--.

Column 6, line 7, "A" should be --a--;
line 63, "abovedescribed" should be --above-described--.

Signed and Sealed this

Twenty-third Day of December, 1986

Attest:

DONALD J. QUIGG

Attesting Officer    Commissioner of Patents and Trademarks